US009800248B2

(12) United States Patent
Villegas et al.

(10) Patent No.: US 9,800,248 B2
(45) Date of Patent: Oct. 24, 2017

(54) LOGIC CIRCUIT BASED ON SPIN VALVES OF THE SPIN-POLARIZED SUPERCURRENT TYPE AND CIRCUIT INTEGRATING SUCH LOGIC GATES

(71) Applicants: THALES, Courbevoie (FR); Centre national de la recherche scientifique, Paris (FR)

(72) Inventors: Javier Villegas, Clamart (FR); Denis Crete, Palaiseau (FR)

(73) Assignees: THALES, Courbevoie (FR); CENTRE NATIONAL DE LA RECHERCHE SCIENTIFIQUE (C.N.R.S), Paris (FR)

( * ) Notice: Subject to any disclaimer, the term of this patent is extended or adjusted under 35 U.S.C. 154(b) by 0 days.

(21) Appl. No.: 15/311,417

(22) PCT Filed: May 15, 2015

(86) PCT No.: PCT/EP2015/060778
§ 371 (c)(1),
(2) Date: Nov. 15, 2016

(87) PCT Pub. No.: WO2015/173403
PCT Pub. Date: Nov. 19, 2015

(65) Prior Publication Data

US 2017/0085269 A1 Mar. 23, 2017

(30) Foreign Application Priority Data

May 15, 2014 (FR) ..................................... 14 01093

(51) Int. Cl.
*H03K 3/38* (2006.01)
*H03K 19/195* (2006.01)

(52) U.S. Cl.
CPC .......... *H03K 19/1952* (2013.01); *H03K 3/38* (2013.01)

(58) Field of Classification Search
CPC ........................................................ H03K 3/38
See application file for complete search history.

(56) References Cited

U.S. PATENT DOCUMENTS 3,904,889 A * 9/1975 Hamel ............... H03K 19/1952 326/4
5,831,278 A * 11/1998 Berkowitz ............ H01L 39/225 257/31

(Continued)

FOREIGN PATENT DOCUMENTS

GB 2445377 7/2008

OTHER PUBLICATIONS

International Search Report for PCT/EP2015/060778, dated Jun. 30, 2015.

(Continued)

*Primary Examiner* — Patrick O'Neill
(74) *Attorney, Agent, or Firm* — B. Aaron Schulman, Esq.; Stites & Harbison, PLLC

(57) ABSTRACT

This circuit (100) includes: an intermediate layer (103), made from a conductive material and configured according to a pattern; a first electrode and a plurality of electrodes, which includes at least second and third electrodes (126, 127, 128), each electrode including: A polarizer, made from a ferromagnetic material, placed at a particular point of the pattern of the intermediate layer, and having a magnetization; A superconducting layer, made of a superconducting material, arranged on the polarizer; and a control means (112) able to modify the magnetization of the polarizer of the second electrode; another control means (122) able to modify the magnetization of the polarizer of the third electrode; bias terminals for applying a bias signal; and, terminals for measuring an output signal, a level of the (Continued)

output signal being correlated with a mutual orientation of the first, second and third magnetizations.

17 Claims, 7 Drawing Sheets

(56) References Cited

U.S. PATENT DOCUMENTS 8,093,897 B2 * 1/2012 Pan ........................ B82Y 25/00 324/307
9,509,315 B2 * 11/2016 McCaughan ........... H01L 39/10

OTHER PUBLICATIONS

Written Opinion of the International Searching Authority for PCT/EP2015/060778, dated Jun. 22, 2015.
Soulen R J et al: "Andreev reflection: A new means to determine the spin polarization of ferromagnetic materials", Journal of Applied Physics, American Institute of Physics, US, vol. 85, No. 8, Apr. 15, 1999(Apr. 15, 1999), pp. 4589-4591, XP012047191, ISSN: 0021-8979, DOI: 10.1063/1.370417 alinea [000I]-alinea [00IV]; figures 1-4.
Klapwijk T M: "Proximity Effect From an Andreev Perspective", Journal of Superconductivity: Incorporating Novel Magnetism, Kluwer Academic Publishers—Plenum Publishers, NE, vol. 17, No. 5, Oct. 1, 2004 (Oct. 1, 2004), pp. 593-611, XP019285140, ISSN: 1572-9605 cite dans la demande le document en entier.

* cited by examiner

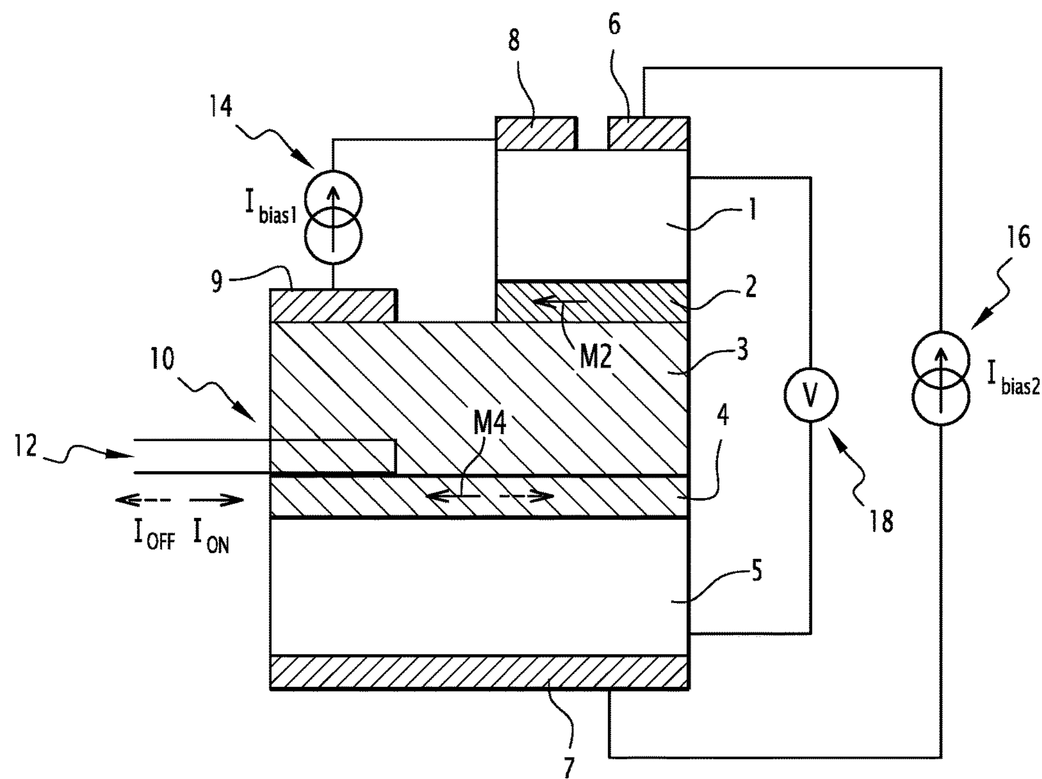
FIG.5
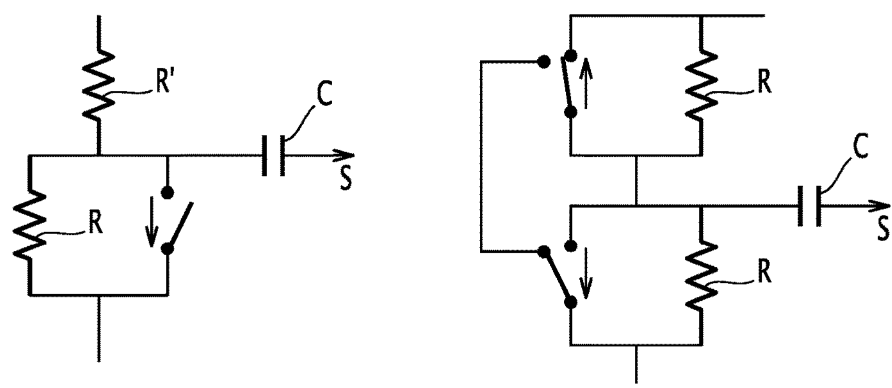
FIG.10
FIG.11

LOGIC CIRCUIT BASED ON SPIN VALVES OF THE SPIN-POLARIZED SUPERCURRENT TYPE AND CIRCUIT INTEGRATING SUCH LOGIC GATES

The present invention relates to logic gates implementing spin valves of the spin-polarized supercurrent type.

The technology of logic gates based on electronic components (based on the circulation of electric charges) has reached its limitations in terms of capacity, speed, functionality, etc.

However, the field of spintronic components (based on spin circulation) is promising. However, different general issues exist.

The first problem is finding materials that allow the information carried by the spin of the electrons to travel undisrupted over long enough distances, in particular to be able to build logic circuits with several input and/or output ports.

The second problem consists of maximizing the ratio between the high signal corresponding to the +1 bit (OFF) and the low signal corresponding to the 0 bit (ON), called ON/OFF ratio hereinafter.

Lastly, the third problem corresponds to reducing the Joule dissipation effect in the form of heat of the electrons carrying spin information.

The spin signal decreasing exponentially over a so-called spin diffusion characteristic length, ISF, the distance over which the polarization of the electronic spin is retained is extremely short.

This polarization retention distance limits the ON/OFF ratio.

One strategy to maximize the spin signal then consists of producing devices that are as small as possible relative to the characteristic length ISF. It should be noted that all of the dimensions of the device, even in the directions perpendicular to the circulation of the spin current, must be small relative to the length ISF, to avoid diffusing spins laterally, and thus to retain the spin signal. However, reducing the cross-section causes an increase in the Joule effect.

Another strategy to improve spintronic devices consists of looking for materials in which the length ISF is long.

However, the length ISF is rarely greater than several tens of nanometers in the metals. The materials with a greater length ISF, such as semiconductors (ISF of several hundred nanometers) or graphene (ISF of several microns) are much more resistive.

The invention aims to resolve this problem.

To that end, the invention relates to a circuit, characterized in that it includes:

- an intermediate layer, made up of a material conducting electric current and configured using a pattern;
- a first electrode and a plurality of electrodes, which includes at least second and third electrodes;

each electrode including:

- A polarizer, made from a ferromagnetic material, placed at a particular point of the pattern of the intermediate layer, and having a magnetization,
- A superconducting layer, made from a superconducting material, arranged on a surface of the polarizer opposite a surface of the polarizer in contact with the intermediate layer;
- at least one control means able to modify the magnetization of the polarizer of an electrode from among the second and third electrodes;

- at least one other control means able to modify the magnetization of the polarizer of the other electrode from among the second and third electrodes;

the first and second electrodes on the one hand, and the first and third electrodes on the other hand, making up two spin valves of the spin-polarized supercurrent type,

- bias terminals for applying a bias signal; and
- terminals for measuring an output signal, a level of the output signal being correlated with a mutual orientation of the first, second and third magnetizations.

According to specific embodiments, the component includes one or more of the following features, considered alone or according to any technically possible combinations:

- the pattern being a band, the first, second and third electrodes are successively arranged along the length of said band, arranging a space between them, and the measuring terminals are arranged at the ends of the band, on either side of the electrodes, the level of the output signal then corresponding to a logic "OR" between the magnetizations of the second and third electrodes, the first magnetization being fixed, or complementary to a logic "EQV" between the magnetization of the first, second and third electrodes;
- the first and third electrodes each bear a bias terminal for applying the bias signal, which is a current, and the output signal is a voltage measured across the measuring terminals;
- the pattern includes:
  - upstream and downstream portions each made up of a band that is in electrical contact with one of the measuring terminals; and
  - an intermediate portion made up of a loop-shaped band defining an upper branch and a lower branch,
    - the first electrode being placed on the upstream portion, the second electrode on the lower branch, and the third electrode on the upper branch, an output signal level taken across the measuring terminals situated at the ends of the pattern corresponds to a logic "AND" between the magnetizations of the second and third electrodes;
- the pattern includes:
  - upstream and downstream portions each made up of a band that is in electrical contact with one of the measuring terminals, a first electrode being placed on the upstream portion downstream from the measuring terminal, a magnetization of the first electrode corresponding to a logic level C; and
  - an intermediate portion made up by the placement in electrical parallel of several bands each defining branches, each branch being identified by an integer k, being connected on the one hand to the upstream portion and on the other hand to the downstream portion and bearing an electrode, including a magnetization corresponding to a logic level Vk,
    - an output signal level taken across the measuring terminals situated at the ends of the pattern corresponds to a logic function NOR($V_k$==C) between the magnetizations of the electrodes;
- the output signal is a voltage measured across the measuring terminals, and a polarization current is applied between the bias terminals (I+, I−), whereof a first bias terminal is part of the upstream portion, upstream from the first electrode, and whereof a second bias terminal is part of the downstream portion of the circuit, downstream from the electrodes;
- the intermediate layer being interrupted by a cutout, the output signal is a current traversing a resistance connecting the intermediate layer on either side of the cutout, and the polarization source being a bias voltage applied across the bias terminals situated at each of the ends of the pattern;

the superconducting material of the superconducting layers of each electrode is a superconducting material with a high critical temperature, preferably YBCO;

a thickness of the superconducting layers of each electrode is chosen between 20 and 40 nm, preferably 25 and 35 nm, still more preferably equal to 30 nm;

the ferromagnetic material of the polarizers of each electrode is LCMO;

a thickness of the polarizers of each electrode is chosen between 3 and 10 nm, preferably equal to 5 nm;

the material of the intermediate layer is a normal metal, chosen from among normal metal oxides or elementary normal metals;

a thickness of the intermediate layer is chosen between 15 and 25 nm, preferably equal to 20 nm;

the substrate is made from a material chosen from among sapphire and $SrTiO_3$;

a distance between the electrodes and a thickness of the polarizers of the electrodes depends on the coherence length of the charge carriers in the intermediate layer and a coherence length of the charge carriers in the polarizers; and each logic gate being compliant with a gate according to any one of the preceding logic gates.

The invention and its advantages will be better understood upon reading the following description, provided solely as a non-limiting example, and done in reference to the appended drawings, in which:

FIG. 5 is a schematic illustration of a third embodiment of a Josephson junction electronic component;

Figure 6:
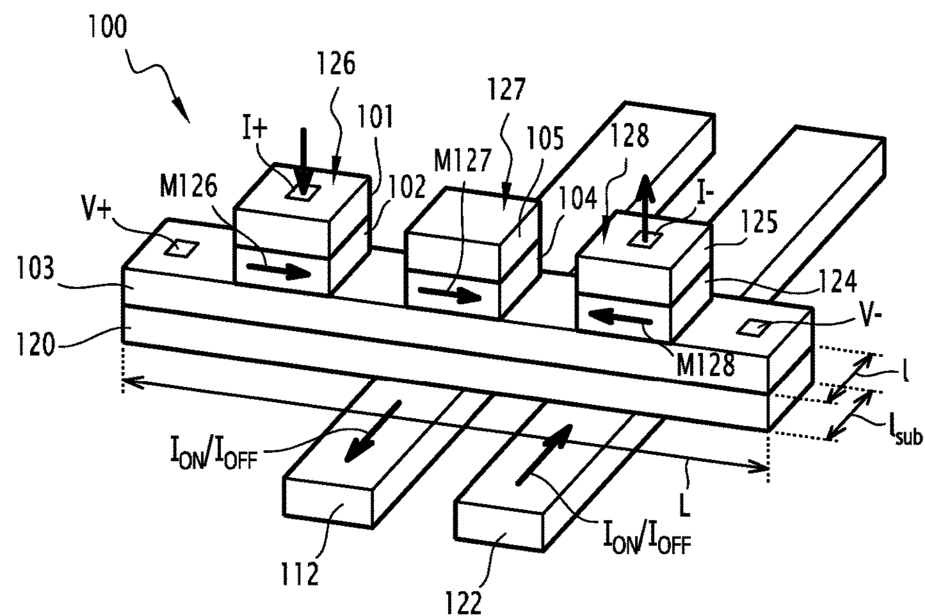
Figure 7A:
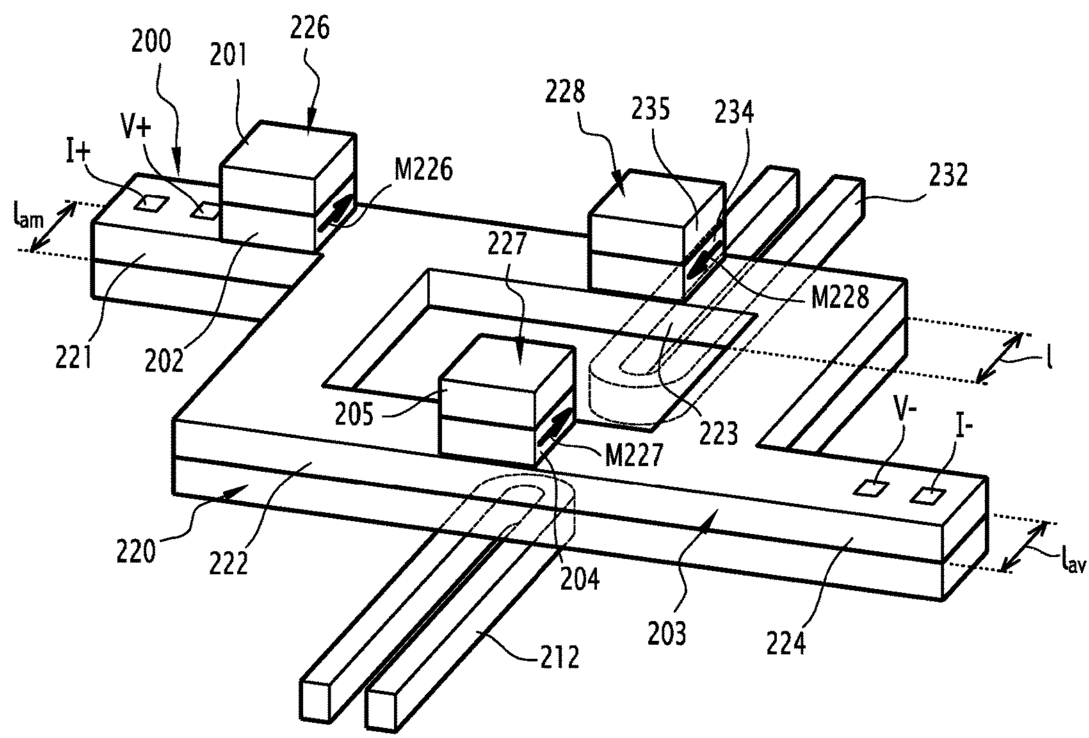
Figure 7B:
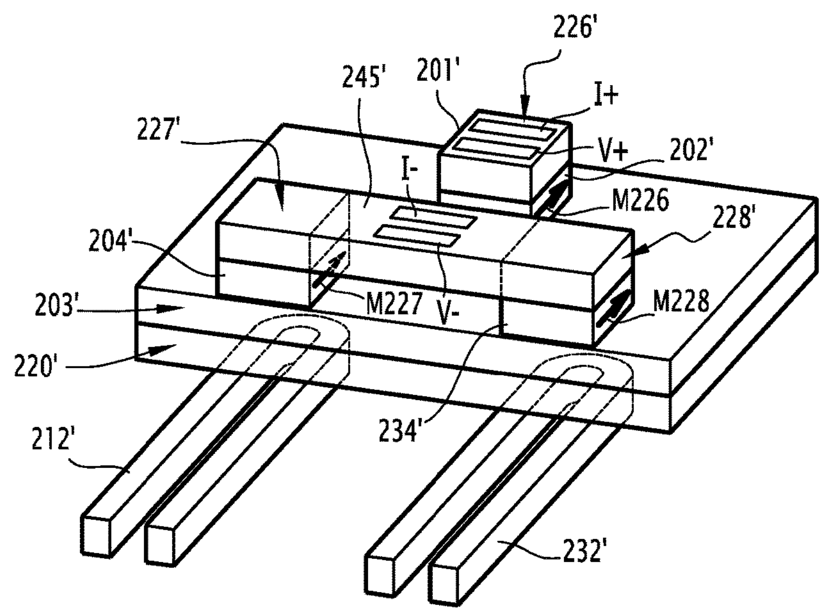

FIG. 6 schematically shows a logic circuit making up a logic “OR” circuit based on spin valves;

FIG. 7*a* schematically shows an “AND” logic circuit based on spin valves;

FIG. 7*b* shows an alternative embodiment of the logic circuit of FIG. 7*a;*

Figure 8:
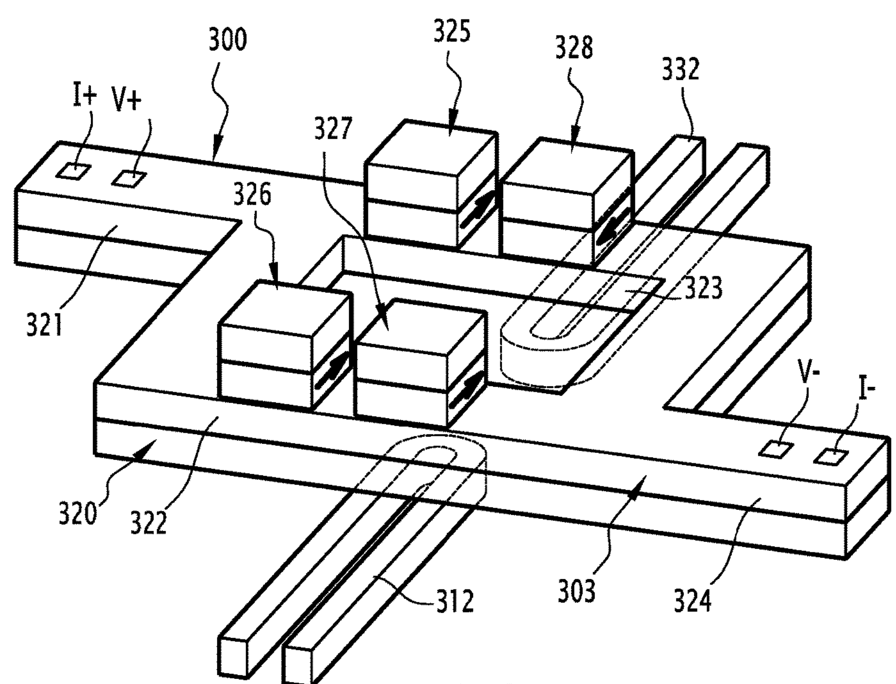

FIG. 8 shows an alternative embodiment of the logic circuit of FIG. 7*a;*

Figure 9:
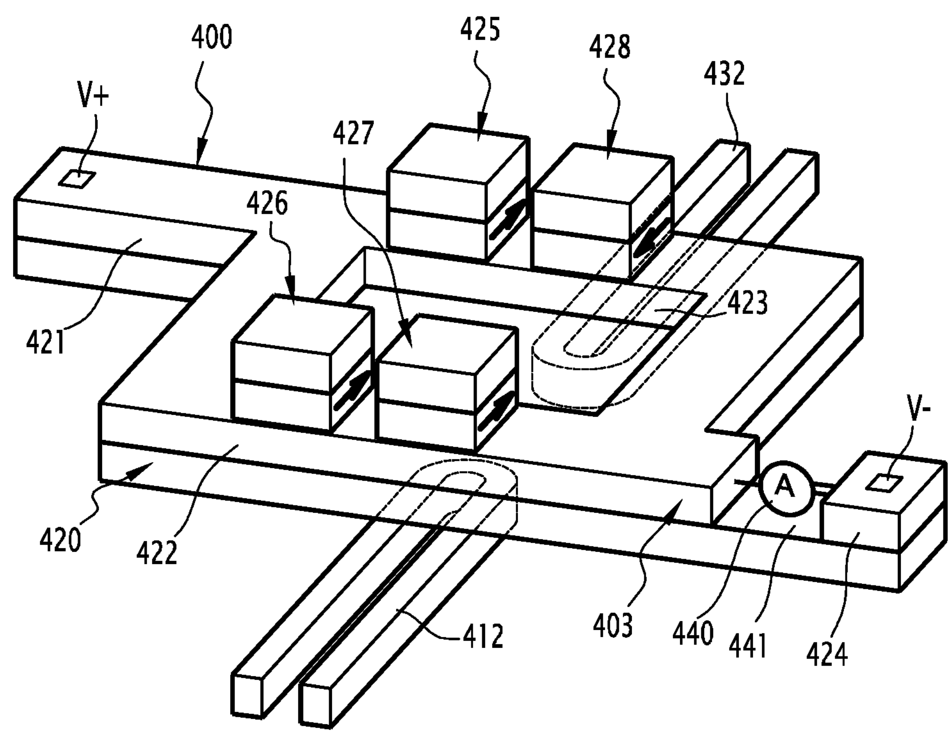

FIG. 9 shows an alternative embodiment of the logic circuit of FIG. 8; and FIGS. 10 and 11 show two ways of placing the logic circuits in a cascade in an electronic circuit.

The logic circuit according to the invention implements a spintronic component using spin-polarized superconductor currents.

After a presentation of such spintronic components, different embodiments of logic circuits will be presented.

The spintronic component implements a Josephson junction.

Figure 1:
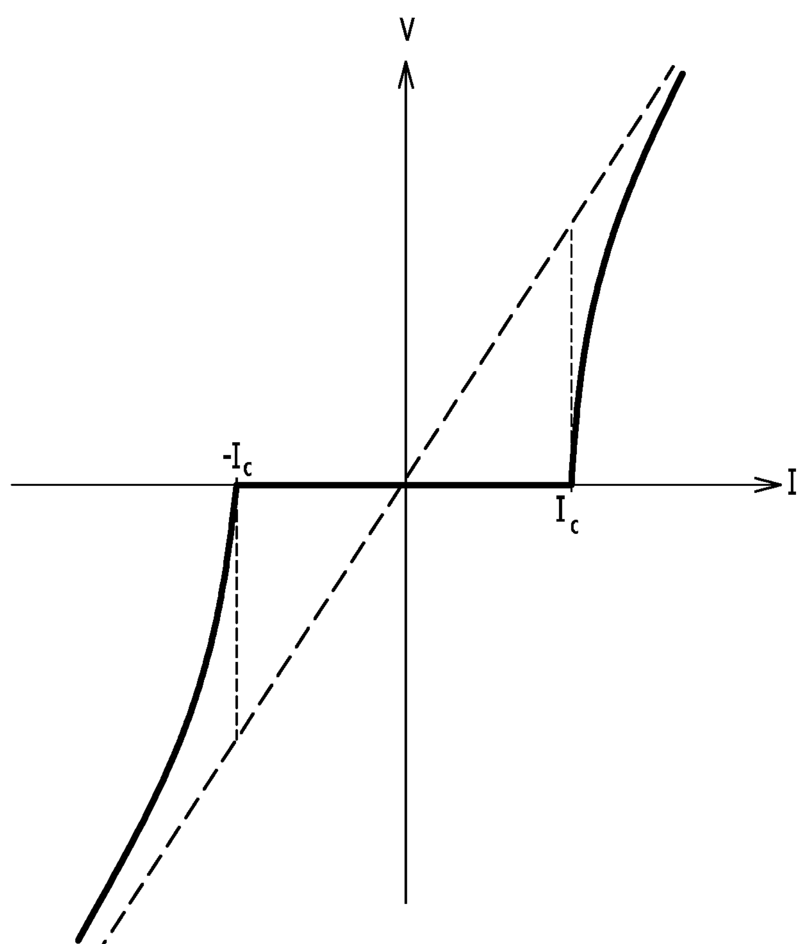
FIG. 1 is a generic current-voltage graph of an electronic component of the Josephson junction type.

Such a Josephson junction will now be presented generally in reference to FIG. 1.

In a known manner, a Josephson junction includes first and second layers made from a superconducting material, separated from one another by an intermediate layer of a non-superconducting material.

In a superconducting medium, the charge carriers are formed on the one hand by normal electrons, and on the other hand by the association of two electrons, within a Cooper pair. In so-called “conventional” superconductors, the associated electrons have opposite spins, the Cooper pair then having a zero spin. The statistic followed by a gas of Cooper pairs is a Bose-Einstein statistic, according to which several Cooper pairs can simultaneously occupy the same quantum state. In particular, at a temperature below a critical temperature, all of the Cooper pairs condense in the same fundamental quantum state.

As a result, the charge carrier gas is described macroscopically by a complex value quantum wave function. This has a phase θ.

In a Josephson junction, although the continuity of the superconductor material is interrupted by the presence of the non-superconductor material of the intermediate layer, coupling exists between the wave functions of the charge carriers in the first and second superconducting layers.

Indeed, according to the Josephson effect, the wave function of the charge carriers of the first superconducting layer extends through the intermediate layer, into the second superconducting layer where it interferes with the wave function of the charge carriers of the second superconducting layer.

The current-voltage characteristic of a Josephson junction, the intermediate material of which is a metal, is shown schematically in FIG. 1.

It is shown that the current I and the voltage QUOTE$^{V}$ V assume the following parametric form:

$$I = \frac{\Phi_0}{2\pi R}\frac{d\varphi}{dt} + I_c \sin\varphi \quad (1)$$

$$V = \frac{\Phi_0}{2\pi}\frac{d\varphi}{dt} \quad (2)$$

Where

The parameter $\phi=\theta_1-\theta_2$ corresponds to the difference between the phases of the wave functions of the charge carriers in the first and second superconducting layers, respectively;

$\Phi_0$ is a constant characteristic of the Josephson effect and is expressed as a function of the Planck constant $\underline{h}$ and the charge of the electron $\underline{e}$ according to:

$$\Phi_0 = \frac{h}{2e};$$

R is called normal resistance and corresponding to the slope of the asymptomatic branches of the current-voltage characteristic;

t represents time; and $I_c$ is a critical current, characteristic of the Josephson junction.

A solution exists for which the phase difference ϕ is constant over time. The voltage V is zero, but a direct current may be circulated through the Josephson junction. This direct current is less than $I_c$, due to the term in sin ϕ in relationship (1).

A solution also exists for which the voltage V is constant and non-zero. The phase difference is then an increasing monotonic function of time. An oscillating current in since traverses the Josephson junction.

It will be noted, without going into detail, that the characteristic parameter $I_c$ is a function of the component of the magnetic field in a plane transverse to the stacking direction of the layers of the Josephson junction.

Figure 2:
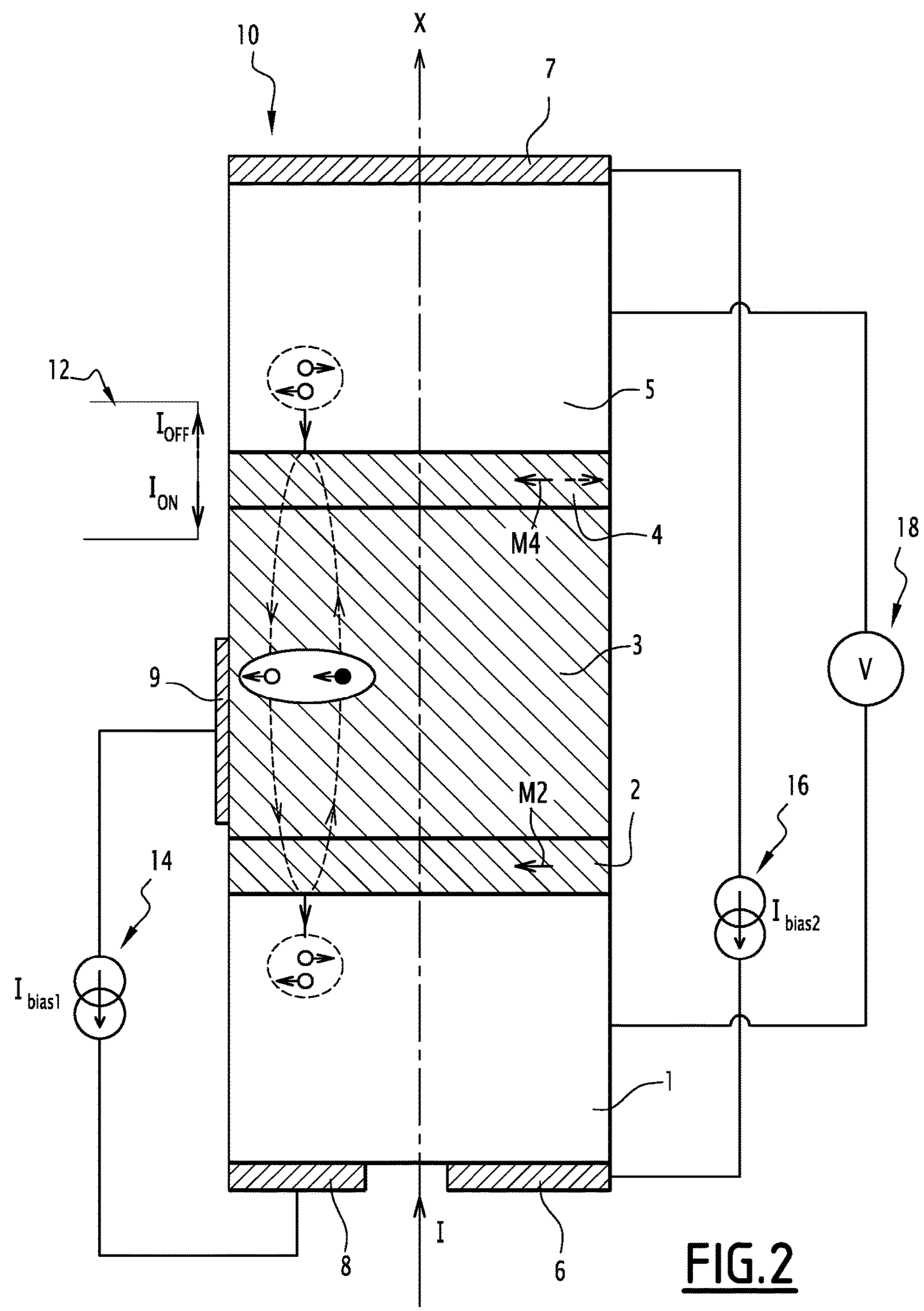
FIG. 2 is a schematic illustration of a first embodiment of a Josephson junction electronic component.

In reference now to FIG. 2, a first embodiment of a Josephson junction spintronic component will be presented.

According to this first embodiment, the component 10 results from the stacking, along a stacking direction X, of a first layer 1, a first polarizer 2, an intermediate layer 3, a second polarizer 4, and a second layer 5.

The first and second layers 1 and 5 are made from a superconducting material. This preferably involves a superconductor material with a high critical temperature, i.e., exhibiting superconductor properties for temperatures in the range from 25 to 120 K. This is for example a mixed barium copper and yttrium oxide, called YBCO. The $YBa_2Cu_3O_7$ oxide is preferably used.

A thickness of the first and second layers 1 and 5 can a priori be chosen randomly. However, the minimum thickness depends on the material used. For YBCO, the thickness of the first and second layers is chosen between 5 and 50 nm, preferably between 20 and 40 nm, still more preferably equal to 30 nm.

The intermediate layer 3 is made from an electrically conductive material. The material of the intermediate layer is for example chosen from among complex oxides, such as $LaNiO_3$ oxide, elementary normal metals, such as copper Cu, silver Ag, gold Au, etc., or semiconductors.

A thickness of the intermediate layer 3 shall be smaller than a so-called coherence length $L_N$ in the conductive material, which depends on the material actually used for the intermediate layer. For example, for $LaNiO_3$, the thickness is chosen between 0.1 and 100 nm, preferably as short as possible, for example equal to 20 nm.

The first and second polarizers 2 and 4 are made from a ferromagnetic conductive material. This ferromagnetic material is preferably a Lanthanum Calcium Manganese Oxide (LCMO). A ferromagnetic medium corresponding to formula $La_{0.7}Ca_{0.3}MnO_3$ is preferably used.

The first polarizer 2 has a first magnetization M2 in a first magnetization direction. In one simple example embodiment, the first magnetization M2 is constant in direction and intensity during the use of the component and is perpendicular to the stack direction.

The second polarizer 4 has a second magnetization M4. In one simple example embodiment, the intensity of the second magnetization M4 is approximately constant, but its direction and sense relative to the first magnetization direction varies over the course of the use of the component. In one simple embodiment, only the magnetization sense M4 varies along the first magnetization direction, which is constant.

The thicknesses of the first and second polarizers 2 and 4 are chosen to be shorter than a coherence length $L_P$ in the ferromagnetic material. In the case of LCMO, the thickness is preferably between 0.1 and 100 nm, preferably equal to 5 nm.

The physical principle implemented in this component is the Andreev effect (or Andreev reflection). This effect is known and for example described in the article by T. M. Klapwijk, "Proximity effect from an Andreev perspective", Journal of Superconductivity: Incorporating Novel Magnetism, Vol. 17, No. 5, October 2004.

This effect occurs at the interface between a conducting medium and a superconducting medium.

According to this effect, an electron moving in the conducting medium and incident on the interface with the superconducting medium can lead to the transmission of a Cooper pair in the superconductor and the reflection of a hole in the superconducting medium.

The preservation of the pulse requires that, if the electron has a pulse p (vectorial), the Cooper pair will have a pulse 2.p and the whole, a pulse −p.

If the electron has a spin s, the hole will have either a spin −s (the electron-hole pair then making up a singlet whereof the total spin is zero), or a spin s (the electron-hole pair occupying a triple level, the total spin of which is equal to the unit).

In the first case, a so-called conventional supercurrent is generated through the interface. The conventional supercurrent transports a charge, but no spin.

In the second case, a so-called nonconventional supercurrent is generated through the interface. This requires a so-called "spin-flip" process at the interface between the superconducting medium and the conducting medium, which is in particular present when the conducting medium is a ferromagnetic medium (for example, LCMO). The nonconventional supercurrent thus transports a charge and a spin.

As a result of this effect, the wave function of the electron/hole pairs in the conducting medium is coupled, at the interface, with the wave function of the Cooper pairs of the superconducting medium.

Since the nonconventional supercurrent is spin-polarized, it is sensitive to the polarization effects at the interface between the conducting medium and the superconducting medium. The presence of a polarizer (having a determined magnetization) at the interface between the conducting medium and the superconducting medium makes it possible to select, among the electrons or the incident holes, the electrons or holes whereof the spin is parallel to the magnetization of the polarizer, and consequently, those which may actually participate in the circulation of a nonconventional supercurrent through the interface.

In the component described above, a polarizer 2, 4, respectively, is provided at the interface between the intermediate layer 3 and the superconductor layer 1, 5, respectively, so as to control the nonconventional supercurrent at each interface.

Furthermore, the electron/hole pairs generated at an interface can circulate in the intermediate layer 3. For example, an electron-hole pair generated at the interface between the intermediate layer 3 and the second superconductor layer 5 bearing a nonconventional supercurrent can circulate through the intermediate layer 3 up to the interface between the intermediate layer 3 and the first superconducting layer 1 to participate in a nonconventional supercurrent at this interface.

As a result, related states exist between the electron/hole pairs in the intermediate layer and the Cooper pairs in the first superconducting layer 1 and in the second superconducting layer 5. There is therefore an interaction between the wave functions of the charge carriers of the first and second superconducting layers, via a mechanism for generating and transmitting electron/hole pairs through the intermediate layer.

To effectively introduce mutual coupling between the wave functions of the first and second superconducting layers, the thicknesses of the ferromagnetic layers 2 and 4 and the intermediate layer 3 are chosen as a function of the coherence length $L_P$ of the electron/hole pairs in the ferromagnetic material and of the coherence length $L_N$ of the electron/hole pairs in the intermediate material. For example, the smallest coherence length between these two lengths is chosen as a constraint.

In general, for a material whose coherence length is written:

$$l_i = \frac{\hbar v_{Fi}}{2\pi KT} \text{ in the ballistic regime,}$$

or $$l_i = \sqrt{\frac{\hbar D_i}{2\pi KT}} \text{ in the diffusive regime.}$$

Where

T is the absolute temperature;

K is the Boltzmann constant;

$\hbar$ is the reduced Planck constant;

$v_{Fi}$ is the Fermi speed in the material i; and $D_i$ is the electronic diffusion constant in the material i.

The measurements of the coherence length $L_P$ show that it is greater than 30 nm in LCMO.

In light of the Fermi speed $v_{FN}$, which is equal to about $10^5$ m/s in $LaNiO_3$, the coherence length $L_N$ is longer in this material than the length $L_P$ (especially when the conducting a material is brought to a low temperature), and even longer in metals such as Au or Ag.

By placing a polarizer at each of the interfaces between the intermediate layer and the superconducting layers, a polarizer/analyzer assembly is created making it possible to control the relative polarization of the nonconventional supercurrent through each interface: If the first and second magnetizations are antiparallel (180° with respect to one another), none of the charge carriers, electron or hole, generated at the first interface with a spin parallel to the first magnetization will be able, after circulation through the intermediate layer, to traverse the second polarizer and reach the second interface. No superconducting current will be able to traverse the Josephson junction. The latter will be in a blocked state.

Conversely, when the first and second magnetizations are parallel to one another (0°), a charge carrier, electron or hole, generated at the first interface with a spin parallel to the first magnetization will be able, after circulation through the intermediate layer, to traverse the second polarizer and reach the second interface, where it will be able to participate in generating a current. A superconducting current will therefore be able to circulate through the Josephson junction. The latter will be in an on state.

The component 10 thus includes a control means 12 able to modify the orientation of the second magnetization M4 along the magnetization direction to place the component either in the on state, in which the first and second magnetizations are parallel to one another, or in an off state, in which the first and second magnetizations are antiparallel to one another.

The control means 12 is for example made up of the circuit making it possible to apply a current pulse along a wire positioned suitably near the second polarizer 4. To control the magnetization state, the control current will have to have an intensity above a control threshold, which will be assumed in the continuation of this description. A current pulse $I_{ON}$ in a first sense makes it possible to move the second magnetization parallel to the magnetization direction; a current pulse $I_{OFF}$ in a second sense, opposite the first, makes it possible to place the second magnetization in antiparallel to the magnetization direction.

Figure 4:
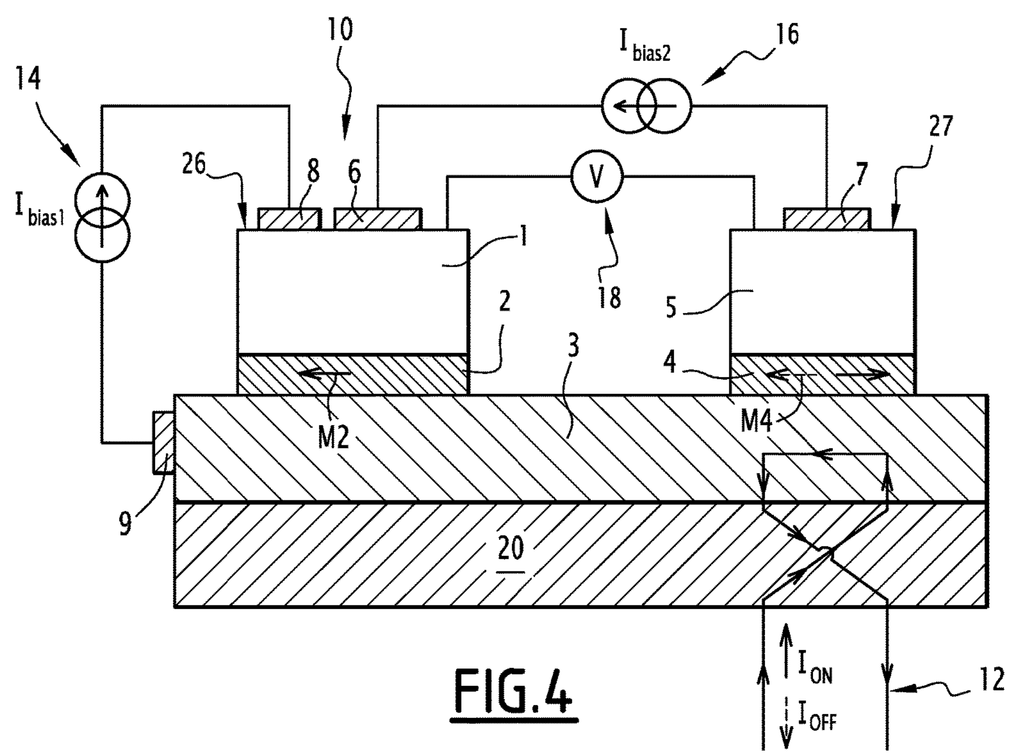

In the logic circuits that will be described below, in which the component 10 is the basic brick, we will choose the pulse $I_{ON}$ to be equivalent to an input bit at "0" and the pulse $I_{OFF}$ to have an input bit at "1". The reverse choice would also be acceptable, resulting in a redefinition of the logic function of the gates described below. Taking the complement of the logic level on an input bit amounts to configuring the control wire such that the control current circulates near the polarizer in an opposite direction, as shown in FIG. 4.

The component 10 can include a first electric polarization source 14 able to apply a first current $I_{bias1}$ between a terminal 8 in contact with the first layer 1 and a terminal 9 in contact with the intermediate layer 3.

The component 10 can include a second electric polarization source 16 able to apply a second current $I_{bias2}$ between a terminal 6 in contact with the first layer 1 and a terminal 7 in contact with the second layer 5.

The component 10 can include a voltage measuring device 18 able to measure the voltage across the first and second layers 1 and 5.

A second embodiment will be described in reference to FIG. 3. The elements of the second embodiment that are similar or identical to those of the first embodiment are indicated using the same reference number.

The component 10 includes a substrate 20. The material of the substrate is for example sapphire, $SrTiO_3$, etc.

An intermediate layer 3 covers substrate 20.

A free upper face of the intermediate layer 3, opposite a lower face in contact with the substrate 20, bears the first and second electrodes 26 and 27, respectively.

The first electrode 26 results from the superposition of a first polarizer 2 made from a ferromagnetic material and a first layer 1 made from a superconducting material.

The second electrode 27 results from the superposition of a second polarizer 4 made from a ferromagnetic material and a second layer 5 made from a superconducting material.

The first and second layers 1 and 5, the first and second polarizers 2 and 4 and the intermediate layer 3 are similar to the corresponding layers of the first embodiment of FIG. 2, in terms of material and thickness.

The first and second polarizers 2 and 4 are advantageously made simultaneously during a growth step of a ferromagnetic material. They then have generally the same thickness.

The first and second layers 1 and 5 are advantageously made simultaneously during a growth step of a superconducting material. They then have generally the same thickness.

In light of the dimensions mentioned above, one technology for producing such a component is electron beam lithography.

The control means 12 includes a wire arranged near the second polarizer 4 such that a current $I_{ON}$ ou$I_{OFF}$ circulating in the wire produces a magnetic field able to modify the orientation of the magnetization M4 of the polarizer 4.

A first electrical polarization or "bias" source 14 can be connected between the intermediate layer 3 and the first superconducting layer 1.

A second electric polarization or "bias" source 16 can be connected to terminals 6 and 7 provided on each of the electrodes 26 and 27, which are for example made by metal deposition, preferably gold deposition, on the layers of superconducting material.

Figure 3:
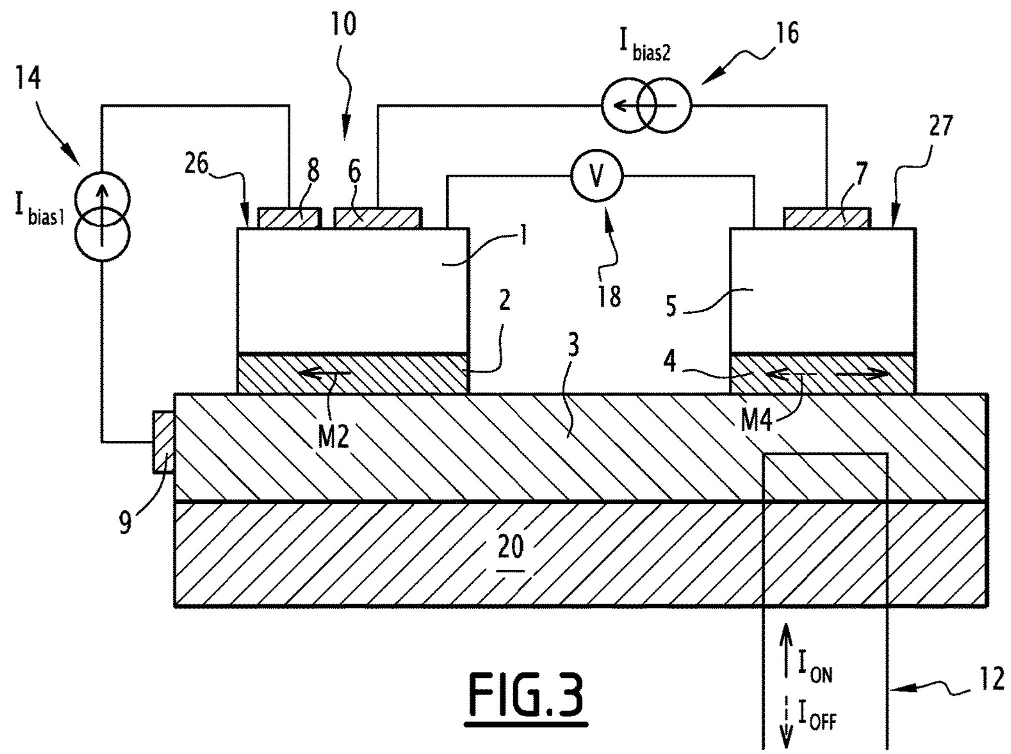
FIGS. 3 and 4 are schematic illustrations of a second embodiment of a Josephson junction electronic component.

FIG. 4 shows an alternative of the embodiment of FIG. 3, which differs from the latter only in that the control wire is configured such that the control current $I_{ON}/I_{OFF}$ circulates near the polarizer in an opposite sense relative to that of the embodiment of FIG. 3. The magnetization of the electrode by the current $I_{ON}$ is reversed, which amounts to taking the complement of the logic signal corresponding to the current $I_{ON}$ applied at the input of the component of FIG. 3. Thus, while a component of FIG. 3 is a logic equivalence "EQV" operator ("1" as input E yields "1" as output S and "0" as input E yields "0" as output S, or S=E), the component of FIG. 4 performs the "NO" logic operation function ("1" as input yields "0" as output, and "0" as input yields "1" as output, or $S=\overline{E}$).

FIG. 5 shows still another embodiment of the component 10. This embodiment is similar to that of FIG. 1, with the exception of the fact that the layers 1 and 2 have a reduced transverse extension relative to the layer 3. In this way, the layer 2 does not cover the entirety of a contact surface of the layer 3, which may then cover the injection terminal 9 of the first current $I_{bias1}$, when the letter exists.

It should be noted that the sense of the first and second bias currents indicated in the figures is arbitrary and may be adjusted as needed, based on the application of the component.

Alternatively, it is the magnetization M2 of the layer 2 that is controlled during the use of the component 10, and not the magnetization M4.

In one possible operating mode of this component, in which the component 10 is only associated with the second electrical polarization source 16, the source 16 is able to apply a current $I_{bias2}$ across the terminals 6 and 7 of the component 10, so as to make it possible, when the component is in the on state (i.e., when the last current pulse received on the control input of the component was equal to $I_{ON}$) and $I_{bias2}$ is below the critical current $I_C$, the circulation of a superconducting current. The voltage V measured with the voltage measuring device 18 is therefore zero. Conversely, when the component is in the off state ($I_{OFF}$), the current circulating through the component is not superconducting, and the voltage measured with the voltage measuring device 18 is non-zero.

In another operating mode, in which the component 10 is associated with first and second electrical polarization sources 14 and 16, the currents $I_{bias1}$ and $I_{bias2}$ are applied simultaneously. If the sum of the currents $I_{bias1}$ and $I_{bias2}$ is such that one is in the part of the current-voltage characteristic of the Josephson junction below the critical current $I_C$, when one switches the component to the on state ($I_{ON}$), a superconducting current circulates through the component. Conversely, when the component is in the off state ($I_{OFF}$) the current circulating through the component is not superconducting, and the voltage measured with the voltage measuring device 18 is non-zero.

One thus obtains a Josephson junction spintronic component able to be controlled other than by varying the voltage applied across its terminals. This component constitutes a spin valve of the spin-polarized supercurrent type.

The control of the change of state of a switch is a magnetic field pulse, which may be caused by the circulation of a control current pulse (in or near the ferromagnetic layer).

In one embodiment in which the state of each of the two ferromagnetic layers 2 and 4 can be controlled, the component then behaves like a "comparison" gate or its "XOR" complement depending on whether the connections of the control wires at the input of the component cause the current to pass in the same sense, or in the opposite sense (using an arrangement of one of the two control wires similar to the diagram of FIG. 4). In the latter case, if one of the two inputs is kept in the zero logic state, the component behaves like an inverter, or "NO" gate.

Incidentally, since the component is sensitive to variations of the magnetic field, a magnetic pulse modifying the magnetization of one of the polarizers so as to switch the component from the off state to the on state, or vice versa, the use of this component as a sensor for detecting variations in the magnetic field can be considered.

Although the principle of the present component can be implemented using a low temperature superconducting material, the use of high temperature superconducting materials is preferable, in particular to allow the integration of the electronic component into circuits implemented in portable micro-cryogenic systems.

Several embodiments of logic circuits integrating at least one spintronic component, the or each component being according to the component described above, will now be described.

An element identical or similar to an element of a preceding embodiment is referenced using a number corresponding to the number used to reference this identical or similar elements, increased by one hundred.

In a first embodiment of a logic circuit, shown in FIG. 6, a logic circuit 100 is an "OR" gate, i.e., producing the "OR" logic operator.

The circuit 100 includes an insulating substrate 120, preferably, configured so as to form a band along a primary direction D. The substrate has a length L and width $I_{sub}$.

The circuit 100 includes an intermediate layer 103 made from a normal metal covering the substrate 120, configured so as to form a band with width I.

A free upper face of the intermediate layer 103, opposite a lower face in contact with the substrate 120, bears first, second and third electrodes 126, 127 and 128, respectively.

The electrodes are spaced apart from one another longitudinally.

Each electrode extends longitudinally over practically the entire width I of the band formed by the intermediate layer 103.

The first electrode 126 results from the superposition of a first polarizer 102 made from a ferromagnetic material and a first layer 101 made from a superconducting material.

The second electrode 127 results from the superposition of a second polarizer 104 made from a ferromagnetic material and a second layer 105 made from a superconducting material.

The third electrode 128 results from the superposition of a third polarizer 124 made from a ferromagnetic material and a third layer 125 made from a superconducting material.

The polarization M126 of the first electrode is fixed and constitutes a reference.

The logic circuit 100 includes a control means 112 for the magnetic polarization M127 of the second polarizer 104 and a control means 122 for the magnetic polarization M128 of the third polarizer 124.

Each control means includes a wire arranged near the corresponding polarizer such that a current $I_{ON}$ ou$I_{OFF}$, with a sense opposite $I_{ON}$, circulating in the wire produces a magnetic field able to modify the orientation of the magnetization of the polarizer.

In general, in the logic circuits described in the present document, the pulse $I_{ON}$ is equivalent to an input bit "0", and the pulse $I_{OFF}$ to an input bit "1". Taking the complement of the logic level on an input bit amounts to configuring the wire such that the control current circulates near the polarizer in an opposite direction, as shown in FIG. 4. In other embodiments, spin-polarized control currents can be injected directly into the polarizers to reverse the magnetization by spin-torque effect.

The circuit 100 includes a measuring terminal at each of the longitudinal ends of the band. The circuit 100 thus includes a measuring terminal V+ and a measuring terminal V−. The output signal measured across the measuring terminals is a measuring voltage.

The circuit 100 includes bias terminals for applying a bias signal. A first bias terminal I+ is situated on the first layer 101 of the first electrode and a second bias terminal I− is situated on the third layer 125 of the third electrode. The bias signal applied across the bias terminals is a bias current.

Between the first and second electrodes on the one hand, and the first and third electrodes on the other hand, are two spin valves of the spin-polarized supercurrent type, each spin valve being according to what has been described above, in terms of material, thicknesses, layers, etc. In particular, the distance between the electrodes and the thickness of the polarizers of the electrodes depends on the coherence length $L_N$ of the charge carriers in the intermediate layer and the coherence length $L_P$ of the charge carriers in the polarizers.

During the use of the circuit 100, the polarization M126 of the first electrode 126 is fixed, while the polarizations M127 and M128 of the second and third electrodes can be modified independently of one another. The second and third electrodes are said to be "free", while the first electrode is said to be a reference electrode.

Below a current threshold $I_C$, a supercurrent may flow between the first bias terminal I+ and the second bias terminal I−, through the first electrode 126, the intermediate layer 103 (passing below the second electrode 127), and the third electrode 128 only if the polarizations M127 and M128 of the second and third electrodes are parallel to the polarization M126 of the first electrode. In this case, a zero voltage is measured between the measuring terminals V+ and V−.

It suffices, conversely, for one of the free electrodes to have an anti-parallel polarization relative to the magnetization M126 of the first electrode, for a non-zero voltage to be measured across the measuring terminals V+ and V−.

From a logical perspective, the level of the measuring voltage across the terminals V+ and V− corresponds to an "OR" operator on the current pulses $I_{ON}/I_{OFF}$ that establish the polarizations of the polarizers of the free electrodes, as shown by the following table, in which the input bit assumes the value "0" for a current pulse $I_{ON}$ (which establishes a magnetization of a free electrode parallel to that of the reference electrode) and the value "1", for a current pulse $I_{OFF}$ (which establishes a magnetization of a free electrode anti-parallel to that of the reference electrode). A non-zero measured voltage is equivalent to an output bit "1", while a measured voltage close to zero volts is equivalent to an output bit "0".

| Current pulse through the wire that commands the polarization of the second electrode relative to the first electrode | Current pulse through the wire that commands the polarization of the third electrode relative to the first electrode | Voltage level measured across the terminals V+ and V− |
|---|---|---|
| 1 | 1 | 1 |
| 0 | 1 | 1 |
| 1 | 0 | 1 |
| 0 | 0 | 0 |

In the alternative embodiments of the circuit 100, the fixed polarizer function is performed by the second electrode, the third electrode, respectively, which also generates an "OR" function between the first and third electrodes, the first and second electrodes, respectively.

If the magnetization of the polarizer is not fixed for any of the three electrodes, one obtains a logic circuit behaving like a gate with three inputs A (corresponding to the magnetization of the first polarizer), B (corresponding to the magnetization of the second polarizer) and C (corresponding to the magnetization of the third polarizer) and an output S (corresponding to the measuring signal), which then corresponds to the additional logic test of "A==B==C?", which corresponds to the generalized logic function "A≠B or B≠C or C≠A", the truth table for which is as follows:

| C | B | A | S |
|---|---|---|---|
| 0 | 0 | 0 | 0 |
| 0 | 1 | 0 | 1 |
| 0 | 1 | 1 | 1 |
| 0 | 0 | 1 | 1 |
| 1 | 0 | 0 | 1 |
| 1 | 0 | 1 | 1 |
| 1 | 1 | 0 | 1 |
| 1 | 1 | 1 | 0 |

FIG. 7a schematically shows a second embodiment of a logic circuit in which the logic circuit 200 is an "AND" gate, i.e., performing the "AND" logic operation.

The circuit 200 thus includes a substrate 220.

The circuit 200 behaves like an intermediate layer 203 deposited on the substrate 220 and configured according to a pattern including an upstream portion 221, an intermediate portion and a downstream portion 224.

The upstream and downstream portions are in band form with widths $I_{am}$ and $I_{av}$.

The intermediate portion includes a loop defining an upper branch 223 and a lower branch 222.

The lower 222 and upper 223 branches form bands with width I.

An upper face of the intermediate layer 203 bears first, second and third electrodes 226, 227 and 228, respectively.

The first electrode 226 is placed on the upstream portion 221 of the pattern of the substrate 220.

The second electrode 227 is placed on the lower branch 222 of the intermediate portion of the pattern.

The third electrode 228 is placed on the upper band 223 of the intermediate portion of the pattern.

Each electrode extends longitudinally over practically the entire width I of the intermediate layer 203.

The first electrode 226 results from the superposition of a first polarizer 202 made from a ferromagnetic material and a first layer 201 made from a superconducting material.

The second electrode 227 results from the superposition of a second polarizer 204 made from a ferromagnetic material and a second layer 205 made from a superconducting material.

The third electrode 228 results from the superposition of a third polarizer 234 made from a ferromagnetic material and a third layer 235 made from a superconducting material.

The circuit 200 includes a control means 212 for the magnetic polarization of the second polarizer 204 and a control means 232 for the magnetic polarization of the third polarizer 234.

Each control means for example includes a wire arranged near the corresponding polarizer such that a current $I_{ON}$ ou$I_{OFF}$ circulating in the wire produces a magnetic field able to modify the orientation of the magnetization of the polarizer. In other embodiments, spin-polarized control currents are injected directly into the polarizers to reverse the magnetization by spin-torque effect.

The circuit 200 includes a pair of measuring terminals, V+ and V−, respectively, situated at each of the ends of the pattern. The first measuring terminal V+ is thus situated on the upstream portion 221 upstream from the first electrode, and the second measuring terminal V− is situated on the downstream portion 224 downstream from the second and third electrodes. In the embodiment of FIG. 7*a*, the output signal is a measuring voltage.

The circuit 200 includes bias terminals for applying a bias signal, which, in the embodiment of FIG. 7*a*, is a bias current. The bias terminals are situated each of the ends of the pattern of the layer 203. The circuit 200 thus includes a first bias terminal I+ upstream from the first electrode 226 and a second bias terminal I− downstream from the second and third electrodes 227 and 228.

The first and second electrodes 226 and 227 on the one hand, and the first and third electrodes 226 and 228 on the other hand, constitute two spin valves of the spin-polarized supercurrent type, each spin valve being according to what has been described above, in terms of material, thicknesses, layers, etc.

During the use of the circuit 200, the polarization M226 of the first electrode is fixed, while the polarizations M227 and M228 of the second and third electrodes can be modified independently of one another.

A supercurrent may flow between the first bias terminal I+ and the second bias terminal I−, through the first electrode 226, the intermediate layer 203 by passing below the second electrode 227 or below the third electrode 228, if the polarization M227 of the second electrode is parallel to the polarization M226 of the first electrode, or if the polarization M228 of the third electrode is parallel to the polarization M226 of the first electrode. In this case, a zero voltage is measured between the measuring terminals V+ and V−.

Conversely, if both free electrodes have an anti-parallel polarization relative to the magnetization M226 of the first electrode, a non-zero voltage is measured across the measuring terminals V+ and V−.

From a logical perspective, the level of the measuring voltage across the terminals V+ and V− corresponds to an "AND" operator on the polarizations of the polarizers of the free electrodes, as shown by the following table, in which the input bit assumes the value "0" for a current pulse $I_{ON}$ (which establishes a magnetization of a free electrode parallel to that of the reference electrode) and the value "1", for a current pulse $I_{OFF}$ (which establishes a magnetization of a free electrode anti-parallel to that of the reference electrode). A non-zero measured voltage is equivalent to an output bit "1", while a measured voltage close to zero volts is equivalent to an output bit "0".

| Input A: Current pulse through the wire that commands the polarization of the second electrode relative to the first electrode | Input B: Current pulse through the wire that commands the polarization of the third electrode relative to the first electrode | Output S: Voltage level across the terminals V+ and V− |
|---|---|---|
| 1 | 1 | 1 |
| 0 | 1 | 0 |
| 1 | 0 | 0 |
| 0 | 0 | 0 |

In an alternative embodiment of the circuit 200, the second, third electrode, respectively, is chosen as spin polarizer by making its magnetization fixed. The logic function then obtained is no longer the "AND" function, but the complement of an implication corresponding to "$\overline{C{=}{>}A}$" when B is set equal to "1" and the truth table for which is as follows:

| C | A | S |
|---|---|---|
| 0 | 0 | 0 |
| 0 | 1 | 1 |
| 1 | 0 | 0 |
| 1 | 1 | 0 |

And corresponding to "no (A=>C)" when B is set equal to "0" and the truth table for which is as follows:

| C | A | S |
|---|---|---|
| 0 | 0 | 0 |
| 0 | 1 | 0 |
| 1 | 0 | 1 |
| 1 | 1 | 0 |

if the magnetization of the polarize is not kept fixed for any of these electrodes, a third input is created on the circuit, which then corresponds to the logic test "A==C AND B==C?", the truth table for which is as follows:

| C | B | A | S |
|---|---|---|---|
| 1 | 1 | 1 | 1 |
| 1 | 0 | 1 | 0 |
| 1 | 1 | 0 | 0 |
| 1 | 0 | 0 | 0 |
| 0 | 1 | 1 | 0 |
| 0 | 0 | 1 | 0 |
| 0 | 1 | 0 | 0 |
| 0 | 0 | 0 | 1 |

In an alternative embodiment of the "AND" logic circuit, shown in FIG. 7*b*, the intermediate layer 203' is deposited on a substrate 220'; the first electrode 226' is single and results from the superposition of a first polarizer 202', made from a ferromagnetic material, and a first layer 201', made from a superconducting material, the first polarizer 202' being in contact with the intermediate layer 203'; the second electrode is dual because it is made up of a single second electrode 227', which results from the superposition of a second polarizer 204', made from a ferromagnetic material, and a layer 245', made from a superconducting material, the second polarizer 204' being in contact with the intermediate layer 203', and a third single electrode 228' that results from the superposition of a third polarizer 234', made from a ferromagnetic material, and the layer 245', the third polarizer 234' being in contact with the intermediate layer 203'. Control means 212' and 232' are respectively arranged near the polarizers 204' and 234'. Contacts are deposited on the superconducting layers 201' and 245'.

Thus, the layer 245' is shared by the second and third single electrodes 227' and 228'. It extends above the polarizers 204' and 234'.

The advantage of this alternative embodiment is that it constitutes a highly compact structure.

An "AND" gate with multiple inputs is easy to produce by increasing the number of polarizer pins, made from a ferromagnetic material, between the intermediate layer and the shared layer of superconducting material, each pin being associated with a control means making it possible to control its magnetization. The contacts will preferably be on the superconducting layer of the first electrode and on the shared superconducting layer.

In another alternative, the intermediate portion of the logic circuit is made up by the placement in electrical parallel of several bands each defining branches, each branch being identified by an integer k, being connected on the one hand to the upstream portion and on the other hand to the downstream portion and bearing an electrode, the magnetization of which corresponds to a logic level $V_k$.

The magnetization of the first electrode, placed on the upstream portion preferably downstream from the measuring terminal, corresponding to a logic level C, the level of the output signal considered between the measuring terminals situated at the end of the pattern of the circuit corresponds to a NOR($V_k$==C) logic function, the output S of which is equal to "1", if all of the $V_k$ are different from C, the truth table of which is as follows (in which "x" indifferently represents the values "0" and "1"):

| C | $V_i$ | $V_{k \neq i}$ | S |
|---|---|---|---|
| 0 | 1 | 1 | 1 |
| 0 | 0 | x | 0 |
| 1 | 0 | 0 | 1 |
| 1 | 1 | x | 0 |

FIG. 8 shows an alternative embodiment of the logic circuit of FIG. 7. According to this alternative, the circuit 300 includes two first electrodes.

A first upper electrode 325 is arranged on the upper branch 323 of the pattern, upstream from the third electrode 328.

A first lower electrode 326 is arranged on the lower branch 322 of the pattern, upstream from the second electrode 327.

When the polarizations of the first upper and lower electrodes are equal in orientation, the described operation of the circuit 200 is found. When the polarization of one of these two electrodes is reversed, this amounts to reversing the command of the corresponding input, electrically performing the same reversal function as described for the embodiment of FIG. 4.

FIG. 9 shows an alternative embodiment of the circuit of FIG. 8. According to this alternative, the circuit 400 is bias voltage-polarized and the output signal corresponds to the current traversing a resistance 440.

The circuit 400 thus includes a pair of bias terminals V+ and V− at each of the ends of the pattern of the substrate 420. The measuring terminals of the output signal are not shown in FIG. 9.

In the circuit 400, the intermediate layer 403 is interrupted in the downstream portion 424 of the pattern. It has a cutout 441. A resistance 440 is connected on either side of the cutout 441. The resistance 440 causes a voltage to appear upon the passage of a current. Very schematically, if the logic circuit 400 is voltage-polarized, this voltage is found across the terminals of the resistance 440 if the circuit is in the "0" state (superconducting state), or distributed across the terminals of the electrodes and the resistance 440 in proportion to the relative values of the resistance 440 and the resistance of the layer 420 in the "1" state (normal non-superconducting state).

It should be noted that the current circulating in the control wires is able to generate a magnetic field capable of reversing the magnetization of the polarizer situated in its vicinity. For LCMO electrodes, the coercive field must be approximately several tenths of Gauss. Taking into account the total thickness of the substrate and the intermediate layer, a control current of about 0.1 mA is sufficient to generate a magnetic field of about 20 Gauss.

If one chooses to use weaker control currents, or if the magnetic fields to be generated are higher, in place of conductive wires, small coils may be used as control means, on the condition that a current is circulated through the polarizer. Alternatively, to manipulate the polarization direction via spin-torque effects, it is possible to consider injecting current pulses through the polarizer to spin polarize the latter directly.

The modification of the magnetization state of a free electrode requires only a short pulse.

Given that the logic circuit works below the superconducting transition, these wires or coils of the control means could be made from YBCO. This has the advantage of a practically zero power dissipation in the control circuit.

The logic circuits described above can be placed in a cascade to obtain logic circuits performing complex functions, like what is known by those skilled in the art in semiconductor logic circuits.

The logic circuits described above behave like an equivalent resistance R in parallel with a perfect switch. Consequently, it is easy to adapt the equivalent resistance of the logic circuit based on the surrounding electronics.

The output of a logic circuit with spin-polarized supercurrent spin valves can be compared to the "open collector" configuration, which is used with semiconductor logic circuits: in this case, the output stage of the logic circuit is equivalent to a switch whereof one of the terminals is connected to the ground and the output signal is stable.

However, the logic circuit with spin-polarized supercurrent spin valves does not require the input signals applied to the polarizing electrodes to be stable: the input signal can be stable or pulsed. In both cases, the control current must be able to change signs to change the polarity of the magnetization of the polarizer of each polarizing electrode. If only pulses are used to control the inputs of the logic circuit, a RC differentiating circuit may be used, like that shown in FIG. 10.

In the figures, the vertical arrow symbolizes the switching signal of the polarization of an electrode and the arrow to the right represents the output S of the logic circuit. The latter may be connected to the input of another logic circuit, in a cascade.

In one preferable version shown in FIG. 11, the capacitor C is associated with complementary outputs of logic circuits mounted mirrored to avoid the limitation of the speed by the RC time constant, to power the input of the line (wire or coil generating the magnetic control field of the logic circuit in a cascade.

Alternatively, whereas in the embodiments of FIGS. 6 to 9, the polarizers are arranged on the intermediate layer, the superconducting layers being arranged on the polarizers, other stacking structures can be considered, for example reverse stacking, in which the superconducting layers are arranged on the substrate, the polarizers arranged on the superconducting layers, and the intermediate layer of the junction arranged on the polarizers.

The advantages of the present logic circuit are as follows:

- Reducing the dissipation by Joule effect, since the spin information is carried by a supercurrent.
- a very high ON/OFF ratio, given that the change of resistance is comprised between zero and a finite value.

The output of the logic circuit can be either a voltage, or a current, ensuring integration versatility into complex circuit.

The invention claimed is:

1. A logic circuit including:

an intermediate layer, made from an electric current conducting material and configured according to a pattern;

a first electrode and a plurality of electrodes, said plurality of electrodes including at least second and third electrodes;

each electrode including:

A polarizer, made from a ferromagnetic material, placed at a particular point of the pattern of the intermediate layer, and having a magnetization, A superconducting layer, made from a superconducting material, arranged on a surface of the polarizer opposite a surface of the polarizer in contact with the intermediate layer;

at least one control means modifying the magnetization of the polarizer of an electrode among the second and third electrodes;

at least one other control means modifying the magnetization of the polarizer of the other electrode among the second and third electrodes;

the first and second electrodes on the one hand, and the first and third electrodes on the other hand, making up two spin valves of a spin-polarized supercurrent type, bias terminals applying a bias signal; and measuring terminals measuring an output signal, a level of the output signal being correlated with a mutual orientation of the first, second and third magnetizations.

2. The logic circuit of claim 1, wherein, the pattern being a band, the first, second and third electrodes are successively arranged along a length of said band, keeping a space between them, and the measuring terminals are arranged at the ends of the band, on either side of the electrodes, the level of the output signal corresponding to a logic "OR" between the magnetizations of the second and third electrodes, the first magnetization being fixed, or complementary to a logic "EQV" between the magnetization of the first, second and third electrodes.

3. The logic circuit of claim 2, wherein the first and third electrodes each bear a bias terminal for applying the bias signal, which is a current, and the output signal is a voltage measured across the measuring terminals.

4. The logic circuit of claim 1, wherein the pattern includes:

upstream and downstream portions each made up of a straight band, which is in electrical contact with one of the measuring terminals; and an intermediate portion made up of a loop-shaped band defining an upper branch and a lower branch, the first electrode being placed on the upstream portion, the second electrode on the lower branch and the third electrode on the upper branch, the level of the output signal taken across the measuring terminals situated at the ends of the pattern corresponds to a logic "AND" between the magnetizations of the second and third electrodes.

5. The logic circuit of claim 4, wherein the output signal is a voltage measured across the measuring terminals, and a polarization current is applied between the bias terminals, whereof a first bias terminal is part of the upstream portion, upstream from the first electrode, and whereof a second bias terminal is part of the downstream portion of the circuit, downstream from the electrodes.

6. The logic circuit of claim 1, wherein the pattern includes:

upstream and downstream portions each made up of a band, which is in electrical contact with one of the measuring terminals, a first electrode being placed on the upstream portion downstream from the measuring terminal, a magnetization of the first electrode corresponding to a logic level C; and an intermediate portion made up by placing, electrically in parallel, several bands, each band defining a branch, each branch being identified by an integer k, being connected on the one hand to the upstream portion and on the other hand to the downstream portion and bearing an electrode, whose magnetization corresponds to a logic level Vk, an the level of the output signal taken across the measuring terminals situated at the ends of the pattern corresponds to a logic function NOR($V_k$==C) between the magnetizations of the electrodes.

7. The logic circuit of claim 5, wherein the output signal is a voltage measured across the measuring terminals, and a polarization current is applied between the bias terminals, whereof a first bias terminal is part of the upstream portion, upstream from the first electrode, and whereof a second bias terminal is part of the downstream portion of the circuit, downstream from the electrodes.

8. The logic circuit of claim 1, the intermediate layer being interrupted by a cutout, the output signal is a current through a resistance connecting the intermediate layer on either side of the cutout, and the bias signal being a bias voltage applied across the bias terminals situated at each end of the pattern.

9. The logic circuit of claim 1, wherein the superconducting material of the superconducting layers of each electrode is a superconducting material with a high critical temperature.

10. The logic circuit of claim 7, wherein a thickness of the superconducting layers of each electrode is chosen between 20 and 40 nm.

11. The logic circuit of claim 1, wherein the ferromagnetic material of the polarizers of each electrode is LCMO.

12. The logic circuit of claim 11, wherein a thickness of the polarizers of each electrode is chosen between 3 and 10 nm.

13. The logic circuit claim 1, wherein the material of the intermediate layer is a normal metal, chosen among normal metal oxides and elementary normal metals.

14. The logic circuit of claim 13, wherein a thickness of the intermediate layer is chosen between 15 and 25 nm.

15. The logic circuit of claim 1, wherein the substrate is made from a material chosen from among sapphire and $SrTiO_3$.

16. The logic circuit claim 1, wherein a distance between the electrodes and a thickness of the polarizers of the electrodes depend on a charge carrier coherence length in the intermediate layer and a charge carrier coherence length in the polarizers.

17. A circuit including a plurality of logic circuits, wherein each logic circuit is compliant with a logic circuit according to claim 1.

* * * * *